United States Patent [19]

Hughes

[11] Patent Number: 5,798,960
[45] Date of Patent: Aug. 25, 1998

[54] CURRENT MEMORY FOR SAMPLING ANALOG CURRENTS

[75] Inventor: John B. Hughes, Hove, England

[73] Assignee: U.S. Philips Corporation, New York, N.Y.

[21] Appl. No.: 884,975

[22] Filed: Jun. 30, 1997

[30] Foreign Application Priority Data

Jul. 6, 1996 [GB] United Kingdom ............ 9614271

[51] Int. Cl.$^6$ .................... G11C 27/00; G11C 27/02
[52] U.S. Cl. .................... 365/45; 365/233
[58] Field of Search .................... 365/45, 189.01, 365/233, 230.01, 205, 207, 208

[56] References Cited

U.S. PATENT DOCUMENTS

| | | | |
|---|---|---|---|
| 5,400,273 | 3/1995 | Hughes et al. | 365/45 |
| 5,666,303 | 9/1997 | Hughes et al. | 365/45 |

FOREIGN PATENT DOCUMENTS

| | | |
|---|---|---|
| 0608936A2 | 8/1994 | European Pat. Off. . |
| 608936-A2 | 8/1994 | European Pat. Off. . |
| WO9708708 | 3/1997 | WIPO . |
| WO9708709 | 3/1997 | WIPO . |

*Primary Examiner*—David C. Nelms
*Assistant Examiner*—Son Mai

[57] ABSTRACT

A current memory for sampled analogue currents comprises a first, coarse, current memory cell and a second, fine, current memory cell. The first current memory cell senses the input current during a first portion of the first period of the clock cycle, while the second current memory cell senses the input current plus the current produced by the first current memory cell during a second portion of the first period of the clock cycle. The combined outputs of the first and second current memory cells is available during a second period of the clock cycle. The first current memory further comprises a voltage amplifier which increases the effective $g_m$ of a memory transistor in the first memory cell and holds the potential at the junction of the drain electrodes of the memory transistors in each of the memory cells close to a virtual earth.

20 Claims, 7 Drawing Sheets

CURRENT MEMORY FOR SAMPLING ANALOG CURRENTS

BACKGROUND OF THE INVENTION

1. Field of the Invention

The invention relates to a current memory for storing sampled analogue currents, the memory comprising an input, a first coarse, current memory cell which senses a current applied to the input in a first portion of a first period of a clock cycle and subsequently stores the sensed current, a second, fine, current memory cell which senses the difference between the input current and the current stored by the first current memory cell in a second portion of the first period of the clock cycle and subsequently stores the sensed current, and means for combining the currents stored in the first and second current memory cells and feeding them to an output of the current memory during a second period of the clock cycle or a subsequent clock cycle, wherein the first current memory cell comprises a field effect transistor which is diode connected during the first portion of the first period of the clock cycle.

2. Description of Related Art

Such a current memory is disclosed in EP-A-0608936. This current memory, which has been referred to as an $S^2I$ memory presents a virtual earth voltage at its input at the sampling instant (i.e. the end of the second portion of the first period of the clock signal or the "fine phase"). This is largely responsible for the first order cancellation of transmission errors. It has been discovered, however, that during the first portion of the first period or "coarse phase" the input voltage can differ considerably from this value because the coarse memory cell handles the full signal current and the resulting voltage swing can give rise to a number of problems.

In such a current memory at the transition from the coarse to the fine phase the voltage jump at the summing node causes the node capacitance to discharge into the fine memory cell. This problem has been addressed by the use of shorting switches as disclosed in UK Patent Application No. 9517785.3(PHB 34009) but, in practice, the shorting phase has to be kept short to enable sufficient settling time at high clock frequencies and this makes it difficult to control. This is a particular problem in systems with high sampling frequencies and leads to impaired performance.

The voltage jumps on the summing node also create errors resulting from gate-drain feedback capacitance. This problem has been addressed by neutralising the errors by means of cross coupled capacitors in balanced current memories as disclosed in UK Patent Application No. 9517787.9 (PHB 34010).

When these current memories are connected to form an integrator the summing node voltage is reset to virtual earth during each fine phase and on each following coarse phase the summing node is connected via the memory switches to one or other of the coarse memory cells' gate capacitors. This connection causes a transient from which the coarse memory cell only partially recovers. This causes a lower integrator Q-factor. Further, if a resistive attenuator, for example an R-2R ladder network, is used as a current divider for defining small or programmable coefficient values then gross errors can occur on the coarse phase.

SUMMARY OF THE INVENTION

It is an object of the invention to enable the provision of a current memory in which the effects of the disadvantages discussed above can be mitigated.

The invention provides a current memory as set forth in the opening paragraph characterised in that a differential voltage amplifier has a first non-inverting input connected to the input of the current memory, a second inverting input connected to a reference potential source, and an output connected to the gate electrode of the transistor via a switch which is closed during the first portion of the first period of the clock cycle.

The discovery that summing node voltage jumps between the coarse and fine phases and that this causes transmission errors in the memory has resulted in the realisation that these errors can be reduced if the summing node voltage is held constant between the coarse and fine phases. This may be achieved to a substantial degree by the measure according to the invention of including an amplifier in the current sensing arrangement of the coarse memory cell which forces the input voltage on the coarse phase towards the virtual earth.

The second current memory cell may comprise a second field effect transistor, a first switch connected between a voltage reference source and the gate electrode of the second transistor, the first switch being closed during the first portion of the first period of the clock cycle, and a second switch connected between the gate and drain electrodes of the second transistor, the second switch being closed during the second portion of the first period of the clock cycle.

Alternatively the second current memory all may comprise a second field effect transistor and a switch connected between its gate and drain electrodes, the switch being closed during the first period of the clock cycle.

This gives a number of advantages; by avoiding the use of the first switch it is not necessary to make the first and second portions non-overlapping and this enables the settling time of the current memory to be reduced. Additionally the clock generator can be simplified since fewer clock signals are required.

The differential amplifier may comprise a third field effect transistor having its gate electrode connected to a second voltage reference source, its source electrode connected to the memory input, and its drain electrode connected to the gate electrode of the first mentioned transistor.

This provides an amplifier using a minimal number of additional devices

The output of the amplifier may be connected to a reference potential when it is disconnected from the gate of the transistor.

This holds the output potential at a desired potential, for example the reference potential or the virtual earth potential so that it does not undergo a potential jump at the start of the coarse sampling phase.

The invention further provides an arrangement comprising two such current memories , the first current memory sensing a current during a first period of a clock cycle and delivering a stored current during a second period of a clock cycle, and the second current memory sensing a current during the second period of a clock cycle and delivering a stored current during the first period of a clock cycle, wherein a single amplifier is provided which is time multiplexed between the two memories.

In this way a single amplifier can be used with two current memories thus minimising the number of components required. It will be apparent to the person skilled in the art that current memories are frequently used in pairs particularly when implementing integrators or differentiators.

BRIEF DESCRIPTION OF THE DRAWINGS

The above and other features and advantages of the invention will be apparent from the following description, by way of example, of embodiments of the invention with reference to the accompanying drawings, in which.

DESCRIPTION OF THE PREFERRED EMBODIMENTS

Figure 1:
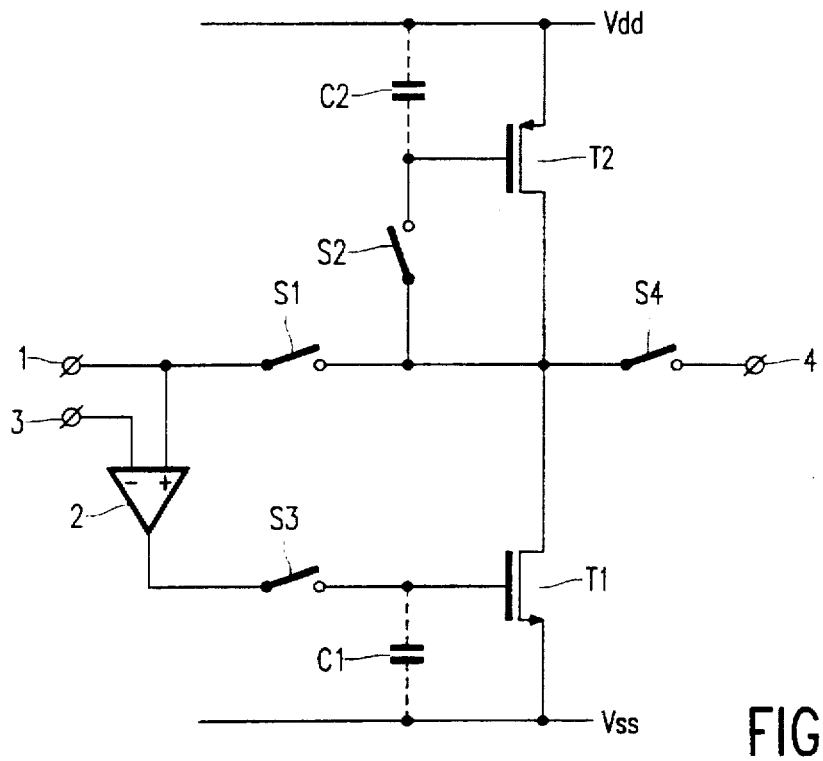
FIG.1 is a circuit diagram of a first embodiment of a current memory according to the invention.
Figure 2A:
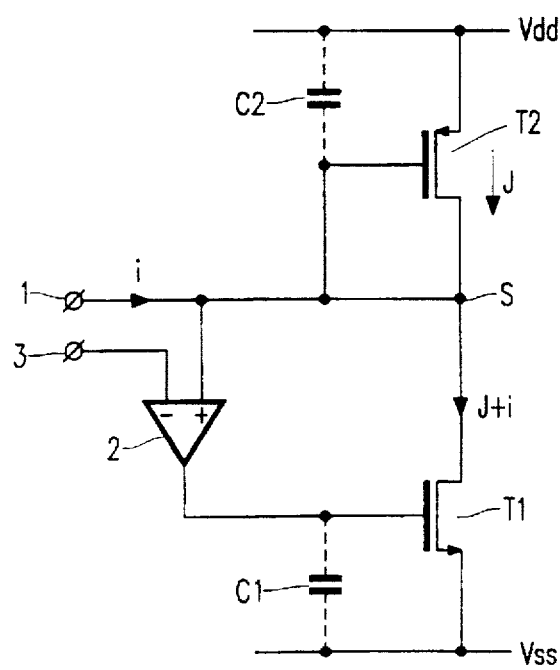
FIG. 2 a,b,c illustrate the operation of the circuit of FIG. 1 on the various phases of a clock cycle.

FIG. 1 shows a current memory according to the invention while FIG. 2a, b, & c illustrate the operation of the current memory. The current memory shown in FIG. 1 has an input 1 to which sampled currents are applied. The input 1 is connected to a first non-inverting input of a differential voltage amplifier 2 and to one end of a switch S1. The other end of the switch S1 is connected to the junction of the drain electrodes of an n-channel field effect transistor T1 and a p-channel field effect transistor T2. The source electrode of transistor T1 is connected to a supply rail $V_{ss}$ while the source electrode of transistor T2 is connected to a supply rail $V_{dd}$. The drain electrode of transistor T2 is connected to its gate electrode via a switch S2. The output of the amplifier 2 is connected via a switch S3 to the gate electrode of transistor T1. A second inverting input of the amplifier 2 is connected to a terminal 3 to which a voltage reference source $V_e$ is connected. The junction of the drain electrodes of transistors T1 and T2 is connected via a switch S4 to an output terminal 4 of the current memory. Capacitors C1 and C2 are shown dotted in the circuit diagram as they will normally be formed as the gate source capacitances of the transistors T1 and T2. It is, of course, always possible to add additional capacitance to the gate-source capacitance of these transistors. The switches S1 and S2 are closed during a first period of a clock cycle hereinafter denoted $\phi1$. The switch S3 is closed during a first portion of the first period of the clock cycle hereinafter denoted $\phi1a$. The switch S4 is closed during a second period of the clock cycle hereinafter denoted $\phi2$.

The transistor T1 with associated capacitor C1, the switches S1 and S3, and the amplifier 2 form a coarse current memory cell all which senses the current when the switch S3 is closed and reproduces the current sensed when the switch S3 is open. The transistor T2 together with its associated capacitance C2 and the switch S2 forms a fine current memory cell which senses the input current plus the current produced by the coarse memory cell during a second portion of the first period of the clock cycle that is when switch S2 is closed and switch S3 is open. At the end of the first period of the clock cycle when the switches S1, S2, and S3 are open both the coarse and the fine current memory cells produce an output current and switch S4 closes to enable the summed output currents of the coarse and fine memory cells to be fed to the output 3.

FIG. 2 illustrates this operation in more detail. On phase $\phi1a$ the circuit is configured as shown in FIG. 2a. The fine memory is diode connected and the amplifier 2 forms a negative feed back loop with the coarse memory transistor T1. If the input current i is equal to 0 then the feedback loop forces the voltage at the summing node S to be equal to $V_e$ and a bias current J is produced by transistor T2 whose magnitude is determined by the reference potential $V_e$ and the geometry of the fine memory transistor T2. When an input current i which is not equal to 0 is applied it will initially flow into the fine memory and so develop a voltage which is amplified by a factor A that is the gain of the amplifier 2, and the output of the amplifier 2 is applied to the gate of the coarse memory transistor. This causes the input current to be diverted away from the fine memory and into the coarse memory. When this cell has settled, substantially all of the signal current together with the bias current J flows into the coarse memory. The currents in the coarse and fine memories are given by $i_N$ and $i_P$ where $$i_N = i\left(\frac{Ag_{mN}}{Ag_{mN} - g_{mP} + g_0}\right) \quad (1)$$

$$i_P = i\left(\frac{g_{mP}}{Ag_{mN} - g_{mP} + g_0}\right) \quad (2)$$

where $$g_0 = g_{oN}' + g_{oP}' + g_{oN} + g_{oP} \quad (3)$$

where $g_{oN}$ and $g_{op}$ drain conductances of the coarse and fine transistors and $g_{oN}'$ and $g_{op}'$ are output conductances of the coarse and fine transistors with open gates.

The voltage $V_s$ at the summing node S is $$V_S = V_e + \frac{i}{Ag_{mN} - g_{mP} + g_0} \quad (4)$$

Figure 2B:
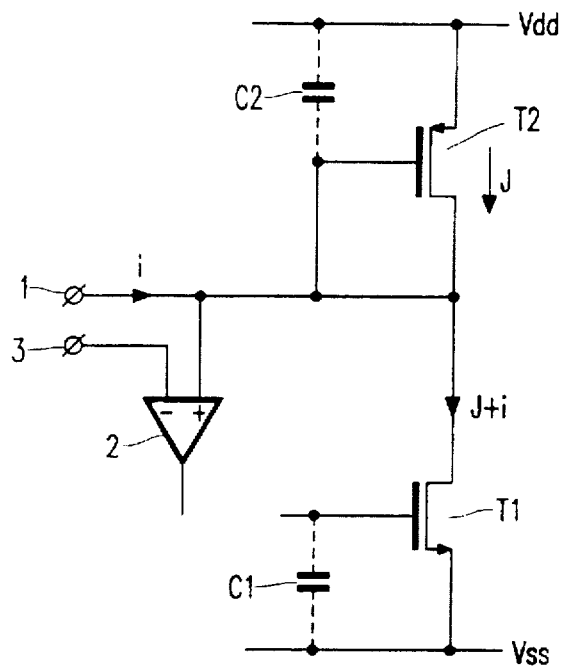

On phase $\phi1b$ the circuit configuration is as shown in FIG. 2b. As can be seen the feedback loop is broken since the switch S3 is now open. Thus the coarse memory cell is no longer sensing the input current but the fine memory cell is now sensing the input current minus the current produced at the output of the coarse memory cell. The currents in the coarse and fine memories are given by $i_{n'}$ and $i_{p'}$ $$i_{N'} = i_N \quad (5)$$

assuming no error resulting from charge injection $$i_{P'} = i\left(\frac{g_{mP}\left(\frac{g_{mP} - g_0}{g_{mP} - g_0'}\right)}{Ag_{mN} - g_{mP} + g_0}\right) \quad (6)$$

The voltage at the summing node S is, $$V_S = V_e + \frac{i\left(\frac{g_{mP} - g_0}{g_{mP} - g_0'}\right)}{Ag_{mN} - g_{mP} + g_0} \quad (7)$$

In practice, $$\left(\frac{g_{mP} - g_0}{g_{mP} - g_0'}\right) \approx 1 \quad (8)$$

and so, $$V_S \approx V_S = V_e + \frac{i}{Ag_{mN} - g_{mP} + g_0} \quad (9)$$

As can be seen from equation (9) a virtual earth has been created on both coarse and fine phases, that is through the φ1 period, with a value of $V_e$ and an input conductance of approximately $Ag_{mN}-g_{mP}+g_0$.

Figure 2C:
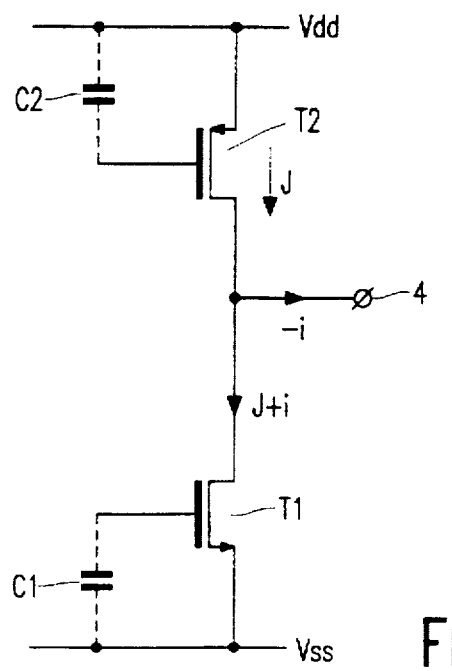

On phase φ2 the circuit configuration is as shown in FIG. 2c. The outputs of the fine and coarse memory transistors combine to give an output current which is an accurate replica of the input current. The output current into a short circuit is given by $$i_0 = i_P - i_N = -i \left( \frac{Ag_{mN} - g_{mP} \left( \frac{g_{mP} - g_0}{g_{mP} - g_0'} \right)}{Ag_{mN} - g_{mP} + g_0} \right) \quad (10)$$

and the transmission error from a current input to the current memory cell to a short circuit load is $$\epsilon = \frac{i_0}{-i} - 1 = - \left( \frac{g_0 + g_{mP} \left( \frac{g_0' - g_0}{g_{mP} - g_0'} \right)}{Ag_{mN} - g_{mP} + g_0} \right) \quad (11)$$

If neutralisation is applied $g_0$ is equal to $g_{0'}$ and the transmission error with neutralisation is given by $$\epsilon_{neut} = - \left( \frac{g_0}{Ag_{mN} - g_{mP} + g_0} \right) \quad (12)$$

and so without neutralisation $$\epsilon \approx \epsilon_{neut} \left( \frac{g_0'}{g_0} \right) \quad (13)$$

In practice $$\frac{g_0'}{g_0} \approx 1.15 \quad (14)$$

and so the benefit of neutralising is small.

It can be seen that by adding the amplifier 2 the summing node voltage may be kept nearly constant through phase φ1 with only minor changes following phase φ1a. Consequently, capacitance at the summing node produces negligible current to discharge into the fine memory. As a result neither shorting switches nor neutralising capacitors are required.

In the arrangement shown in FIG. 1 phase φ1b is defined implicitly by the absence of phase φ1a during phase φ1. Consequently the error current from the coarse sampling process flows immediately following the opening of the switch S3 and there is no loss of settling time through either the non-overlap interval or the shorting period so the memory takes less power. That is with respect to the circuit disclosed in UK Patent Application No. 9517785.3 (PHB 34009). There is also an additional advantage of making the clock generator circuit simpler and consume less power. In addition it will help to offset the loss of loop bandwidth which will result from using the feedback amplifier 2.

It should also be noted that since the input current flows through the switch S1 on phase φ1 a small voltage drop occurs due to its on resistance and the summing node voltage is changed slightly. If the input and output switches are identical however a similar voltage is developed on the output phase φ2 and the voltage does not change from φ1 to φ2. As a result no transmission error results from switch resistance.

Figure 3:
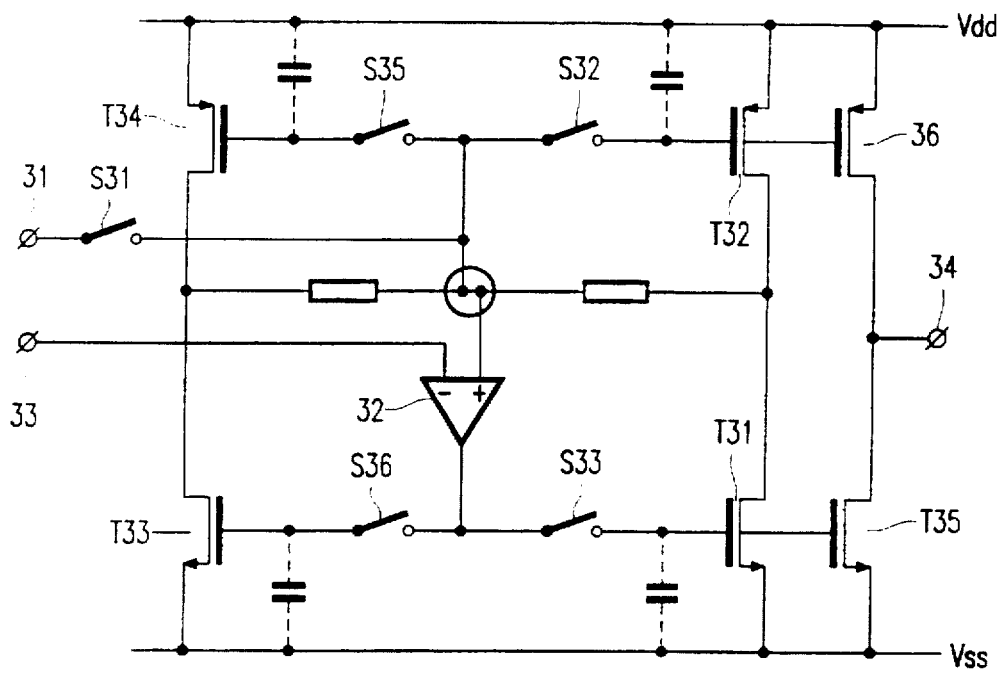
FIG. 3 is a circuit diagram of an integrator according to the invention using two current memories as shown in FIG. 1.

FIG. 3 shows an inverting integrator which is formed from two current memories as shown in FIG. 1 in which the amplifier is time division multiplexed between the two memories. As shown in FIG. 3 the integrator has an input 31 which is connected via a switch S31 to a first non-inverting input of a voltage amplifier 32, to the junction of two resistors R31 and R32, and to the junction of two switches S32 and S35. The junction of the drain electrodes of an n-channel field effect transistor T31 and a p-channel field effect transistor T32 are connected to the other end of resistor R31. The source electrode of transistor T31 is connected to a supply rail $V_{ss}$ while the source electrode of transistor T32 is connected a supply rail $V_{dd}$. The other side of switch S32 is connected to the gate electrode of transistor T32. The junction of the drain electrode of an n-channel field effect transistor T33 and a p-channel field effect transistor T34 are connected to the other end of resistor R32. The source electrode of transistor T33 is connected to the supply rail $V_{ss}$ while the source electrode of transistor T34 is connected to the supply rail $V_{dd}$. The other side of the switch S35 is connected to the gate electrode of the transistor T34. A second, inverting, input of amplifier 32 is connected to a terminal 33 to which a voltage reference supply source is connected. The output of amplifier 32 is connected to the junction of two switches S33 and S36. The other side of switch S33 is connected to the gate electrode of transistor T31 while the other side of switch S36 is connected to the gate electrode of transistor T33. The junction of the drain electrodes of an n-channel field effect transistor T35 and a p-channel field effect transistor T36 is connected to an output terminal 34. The source electrode of transistor T35 is connected to the supply rail $V_{ss}$ while the source electrode of transistor T36 is connected to the supply rail $V_{dd}$. The gate electrode of transistor T35 is connected to the gate electrode of transistor T31 while the gate electrode of transistor T36 is connected to the gate electrode of transistor T32.

The switches S31 and S32 are closed during the clock period φ2, the switch S35 is closed during the clock period φ1, the switch S36 is closed during the clock period φ1a and the switch S33 is closed during the period φ2a.

It will be apparent that the integrator comprises two interconnected current memories of the type shown in FIG. 1. The first current memory comprises transistors T31, T32, and switches S32 and S33 together with resistor R31 and the amplifier 32. The second current memory comprises the transistor T33 and T34, the switches S35 and S36, the resistor R32, and the amplifier 32.

A sampled current to be integrated is applied to input 31 and during phase φ2 is applied to the first current memory together with the output current from the second current memory. The input current and the output current from the second current memory are summed at the summing node S' and the summed current is applied to the input of the first current memory. The output of the amplifier 32 is fed via the switch S33 to the gate electrode of transistor T31. During this time the switches S35 and S36 are open and thus the second current memory is not affected by the operation of the amplifier 32 during phase φ2.

During phase φ1 of the next clock cycle switches S31, S32, and S33 are open and consequently the current applied to the summing junction S' is the output of the first current memory. During the coarse sampling phase switches S35 and S36 are closed and the second current memory operates in the way described with respect to FIG. 1, the amplifier 32 being utilised only by the second current memory since the first current memory switches S32 and S33 are open. This process continues for succeeding clock cycles and the integrated output is available at output 34 which is formed by current mirroring the output of the first current memory cell.

As can be seen the amplifier 32 is time division multiplexed between the first and second memories. The resistors R31 and R32 compensate for the on resistance of the input switches in a manner that is disclosed in UK Patent Application No. 9517791.1 (PHB 34007). The voltage at the summing node S' remains close to $V_e$ throughout the integrators operation even though large and opposite polarity voltages occur at the gates of the coarse memory transistors. In effect the amplifier acts as a buffer and the effect of capacitance at the summing node S' on integrator Q factor is reduced.

Figure 4:
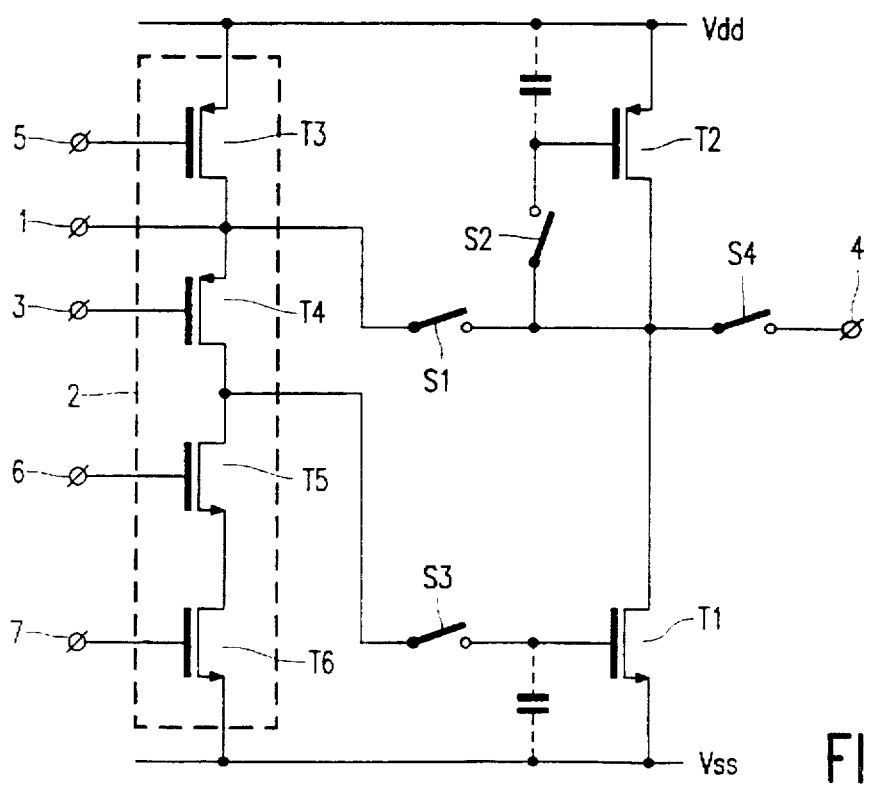
FIG. 4 is a circuit diagram of a second embodiment of a current memory according to the invention in which the amplifier is implemented as a common gate amplifier.

FIG. 4 shows the current memory of FIG. 1 in which the amplifier is implemented as a grounded gate amplifier. In FIG. 4 like elements to those in FIG. 1 have been given the same reference signs. As shown in FIG. 4 a p-channel field effect transistor T3 has its source electrode connected to the supply rail $V_{dd}$ and its drain electrode connected to the input 1. Its gate electrode is connected to a terminal 5 to which a bias voltage source is connected. A further p-channel field effect transistor T4 has its source electrode connected to the input 1 and its drain electrode connected via the switch S3 to the gate electrode of transistor T1. The gate electrode of transistor T4 is connected to the terminal 3. The drain electrode of transistor T4 is further connected to the drain electrode of an n-channel field effect transistor T5 whose gate electrode is connected to a terminal 6 to which a further bias potential source is connected. The source electrode of transistor T5 is connected to the drain electrode of a n-channel field effect transistor T6 whose source electrode is connected to the supply rail $V_{ss}$. The gate electrode of transistor T6 is connected to a bias potential source via a terminal 7.

Transistor T4 is the amplifying transistor of the differential voltage amplifier 2. The current in transistors T3 and T6 must be closely matched. Transistor T5 is a cascode transistor to increase the output impedance of the current source provided by transistor T6.

The operation of the amplifier is as follows:

On phase φ1 the signal i flows into the source of transistor T4 and onto the gate source capacitance of transistor T1. As the voltage at the gate of transistor T1 rises so does the drain current in transistor T1. Equilibrium is established when the current in transistor T1 reaches J+i and the current in transistor T4 returns to I which is the current produced by the current source transistors T3 and T6. If the gain of the amplifier is high then the voltage at the summing node is close to a constant value $V_e$ which is equal to the bias plus $V_{gs}$ where $V_{gs}$ is the gate source voltage of transistor T4 at a drain source current of I so that the arrangement has created a virtual earth at the input node. The feedback introduced by the grounded gate amplifier formed by transistor T4 on phase φ1 increases the memory's low frequency input conductance to $g_i$ where $g_i$ is approximately equal to $g_{mN}XA_{gg}$ where $A_{gg}$ is the voltage gain of the grounded gate amplifier T4.

Figure 5:
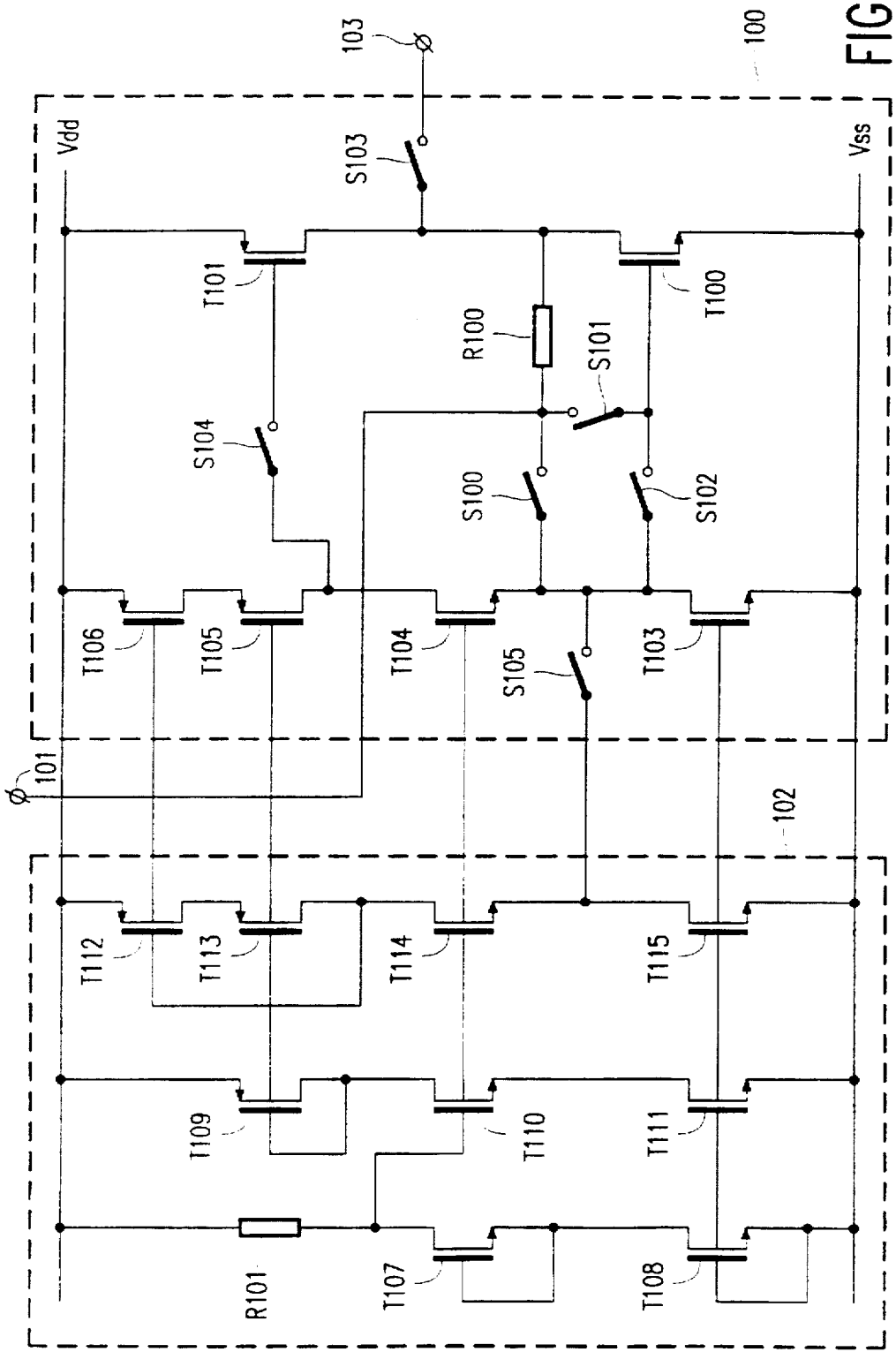
FIG. 5 is a circuit diagram of a third embodiment of a current memory according to the invention.

FIG. 5 shows a further embodiment of a current memory according to the invention. FIG. 5 comprises a current memory 100 and a biasing circuit 102 which produces appropriate biasing voltages for the various transistors of the current memory 100. The current memory 100 has an input 101 which is connected to the junction of a first switch S100, a second switch S101, and a resistor R100. The other end of the switch S101 is connected to the gate electrode of an n-channel field effect transistor T100 and a switch S1 02. The other end of the resistor R100 is connected to the drain electrode of transistor T100. The source electrode of transistor T100 is connected to a supply rail $V_{ss}$ while its drain electrode is further connected to the drain electrode of a p-channel field effect transistor T101 and to a switch S1 03. The other end of the switch S103 is connected to an output 103. The source electrode of transistor T101 is connected to a supply rail $V_{dd}$. The other end of switch S102 is connected to the drain electrode of an n-channel field effect transistor T103 and to the source electrode of a n-channel field effect transistor T104. The source electrode of transistor T103 is connected to the supply rail $V_{ss}$ while the drain electrode of transistor T104 is connected to the drain electrode of a p-channel field effect transistor T105 and to a switch S104. The other end of the switch S104 is connected to the gate electrode of transistor T101. The source electrode of the transistor T105 is connected to the drain electrode of a p-channel field effect transistor T106 whose source electrode is connected to the supply rail $V_{dd}$.

The bias generator 102 comprises a resistor R101 which is connected between the supply rail $V_{dd}$ and the drain electrode of a n-channel field effect transistor T107 whose source electrode is connected to the drain electrode of a further n-channel field effect transistor T108 whose source electrode is connected to the supply rail $V_{ss}$. The gate and drain electrode of transistors T107 and T108 are respectively connected together so that transistors T107 and T108 are connected as diodes. A p-channel field effect transistor T109 has its source electrode connected to the supply rail $V_{dd}$ and its gate and drain electrodes connected to the drain electrode of an n-channel field effect transistor T110. The source electrode of transistor T110 is connected to the drain electrode of an n-channel field effect transistor T111 whose source electrode is connected to the supply rail $V_{ss}$. The gate electrode of transistor T110 is connected to the gate electrode of transistor T107 while the gate electrode of transistor T111 is connected to the gate electrode of transistor T108. A p-channel field effect transistor T112 has its source electrode connected to the supply rail $V_{dd}$ and its drain electrode connected to the source electrode of the p-channel field effect transistor Ti 13. The drain electrode of transistor T113 is connected to the drain electrode of an n-channel field effect transistor T114 and to the gate electrode of transistor T112. The source electrode of transistor of T114 is connected to the drain electrode of an n-channel field effect transistor T115 whose source electrode is connected to the supply rail $V_{ss}$. The gate electrode of transistor T114 is connected to the gate electrode of transistor T110 while the gate electrode of transistor T115 is connected to the gate electrode of transistor T111. The gate electrode of transistor T113 is connected to the gate electrode of transistor T109. The junction of the source electrode of transistor T114 and the drain electrode of transistor T115 is connected via a switch S105 to the source electrode of transistor T104. The gate electrode of transistor T112 is connected to the gate electrode of transistor T106, the gate electrode of transistor T113 is connected to the gate electrode of transistor T105, the gate electrode of transistor T114 is connected to the gate electrode of transistor T104, and the gate electrode of transistor T115 is connected to the gate electrode of transistor T103.

The switches S100, S102, and S104 are closed during the period φ1a, the switch S101 is closed during the period φ1b, the switch S103 is closed during the period φ2 while the switch S105 is closed during the period φ1a.

A consideration of this circuit will reveal that the coarse memory cell is provided by the p-channel transistor T101 while the fine memory cell is provided by the n-channel transistor T100. That is, the current memory has been inverted in polarity with respect to that shown in FIG. 4. By inverting the polarity of the memory it is now possible to produce the grounded gate amplifier T104 as an n-channel field effect transistor rather than a p-channel field effect transistor. The bias generator circuit 102 produces the appropriate bias voltages for the transistor T103, T104, T105 and T106 in the current memory. In addition the voltage Ve is generated at the junction of transistors T114 and T115 and is connected to the source electrode of transistor T104 at all times other than during the period φ1a. The purpose of this is to prevent the output of the amplifier from wandering during the period when the switches S100 and S102 are open so that it is maintained at the virtual earth. By this means the amplifier is in the correct state when the next phase φ1 occurs.

Figure 6A:
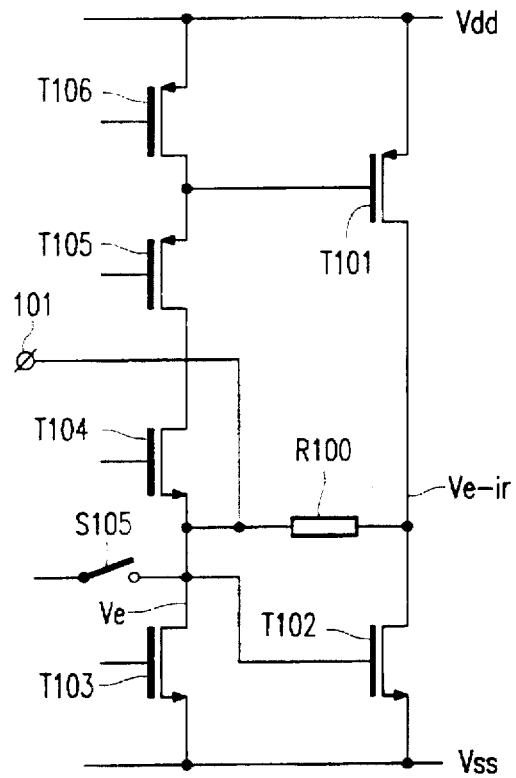
FIG. 6 a,b,c illustrate the operation of the circuit of FIG. 5 on the various phases of a clock cycle.
Figure 6B:
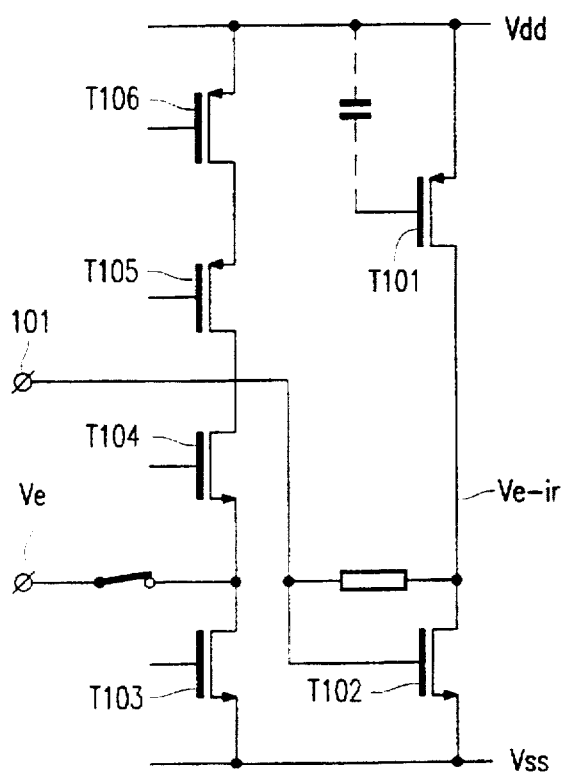
Figure 6C:
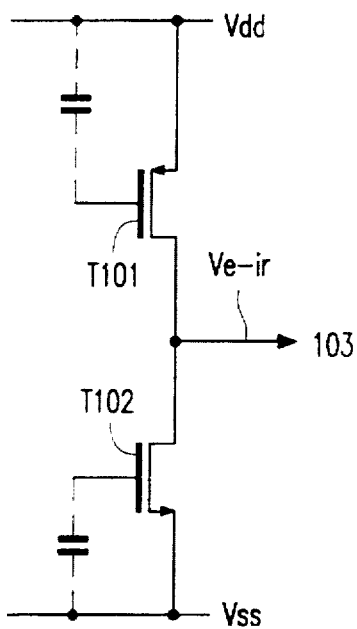

FIG. 6 a, b and c illustrate the operation of the current memory 100 during phases φ1a, φ1b, and φ2 respectively. On phase φ1a, the input current is applied to the input 101 and switches S100, S102 and S104 are closed while switch S101 is open. The voltage at the source electrode of transistor T104 will be Ve due to the bias voltage applied to its gate electrode and consequently the voltage at the junctions of the transistors T101 and T100 will be equal to Ve−ir where i is the input current and r is the resistance of resistor R100. On phase φ1b switches S100, S102 and S104 open and switch S101 closes and the circuit is configured as shown in FIG. 6b, switch S105 closes and the voltage Ve is impressed on the source electrode of transistor T104 from the bias generator circuit 102. The fine current memory cell now senses the input current minus the current produced by the coarse memory cell and the voltage at the junction of the drain electrodes of transistors T101 and T100 is again equal to Ve−ir. On phase φ2 the switch S103 closes and the switch S101 opens, thus both the course and fine current memory cells deliver current to the output 102. The voltage at output 102 will normally be Ve due to the connection to the input of the next memory, but the voltage at the junction of the gate electrodes of transistors T101 and T100 is at the Ve−ir since the switch on resistance will produce a voltage drop of ir.

It should be noted that during phase φ1b, that is when the fine memory cell is sensing the input current minus that produced by the coarse memory cell the amplifier is disconnected from both the coarse and fine memory cells and consequently its noise does not affect the sampling process.

For a single current memory the switch S105 is closed during the period φ1a. If however the amplifier T104 is shared between two current memory cells, either in an integrator as illustrated in FIG. 3 or in a cascade of current memory cells, then a switch S105 will be closed during the periods φ1.φ1a+ee +φ2.+e.ovs φ2a.

Figure 7:
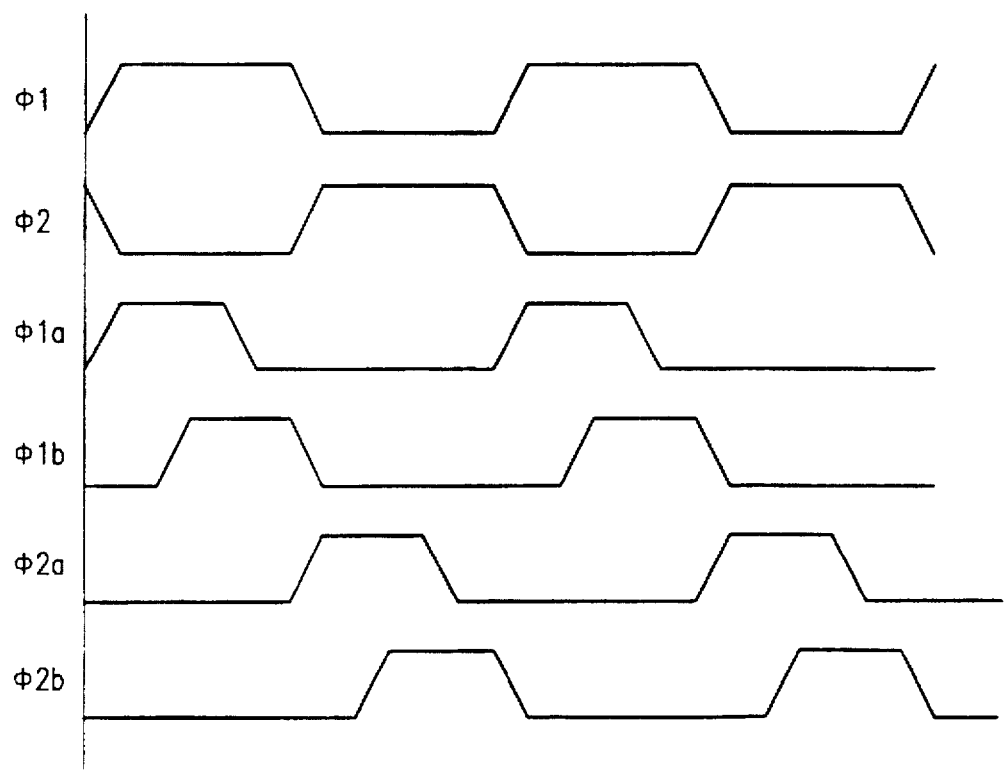
FIG. 7 illustrates the various phases of a clock cycle used in the current memories.

FIG. 7 shows the clock wave forms φ1, φ2, φ1a, φ1b, φ2a, φ2b, which are used in the arrangements of FIGS. 1, 3, 4 and 5. It will be seen from FIG. 7 that the phases φ1a and φ1b and φ2a, and φ2b are overlapping. This is different from the current memory disclosed in EP-A-0 608 936 where the clock phases φ1a, and φ1b have to be non overlapping. The reason the clock phases φ1a and φ1b and correspondingly φ2a and φ2b can be overlapping with this particular current memory is that the fine memory transistor is diode connected during both phases φ1a and φ1b, whereas in the current memory disclosed in EP-A- 0 608 936 the fine memory transistor is diode connected only during phase φ1b or φ2b.

Figure 8:
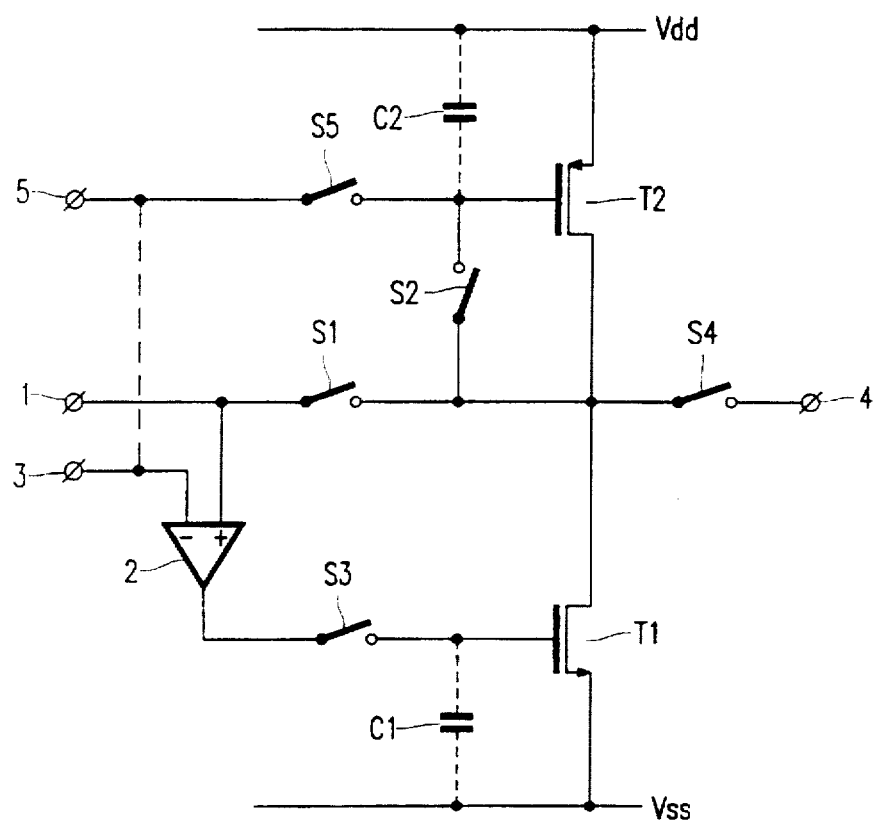
FIG. 8 is a circuit diagram of a fourth embodiment of a current memory according to the invention.

It is however possible to apply the present invention to a current memory as disclosed in EP-A- 0 608 936 and FIG. 8 shows such a current memory. In FIG. 8 those elements having the same form and function as those shown in FIG. 1 have been given the same reference signs. The following description of the embodiment of FIG. 8 will only involve the differences between this embodiment and that shown in FIG. 1. The basic difference is that switch S2 is closed only during phase φ1b, that a further input terminal 5 is provided to which a reference bias source is connected and that a switch S5 is connected between the terminal 5 and the gate electrode of transistor T2. The switch S5 is closed during the period φ1a. The operation of this current memory is as described in EP-A- 0 608 936 except that the provision of the amplifier 2 forces the potential at the summing node to Ve in a similar manner to that described with reference to the embodiment of FIG. 1. In this arrangement it can be seen that it is necessary to make phases φ1a and φ1b non-overlapping as switches S2 and S5 must never be closed simultaneously. It is possible, however, to use the same reference source for the inverting input of the amplifier and the potential to be applied to the gate electrode of transistor T2 during φ1a, that is terminal 5 and terminal 3 could be connected together.

It can be seen that there is advantage in the embodiments of FIGS. 1,3 and 5 which enable the switch S2 to be closed for the whole of the φ1 period and the switch S5 and reference potential at the input 5, to be dispensed with since the clock periods can be made overlapping thus increasing the settling time of the memory. This additional benefit is possible by employing the amplifier 2 in the feedback loop around the coarse memory cell and recognising that it will cause the fine memory cell to produce the bias current J during phase φ1A.

From reading the present disclosure, other modifications will be apparent to persons skilled in the art. Such modifications may involve other features which are already known in the design and use of electrical or electronic circuits and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation of one or more of those features which would be obvious to persons skilled in the art, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A current memory for storing sampled analogue currents, the memory comprising an input, a first, coarse, current memory cell which senses a current applied to the input in a first portion of a first period of a clock cycle and subsequently stores the sensed current, a second, fine, current memory cell which senses the difference between the input current and the current stored by the first current memory cell in a second portion of the first period of the clock cycle and subsequently stores the sensed current, and means for combining the currents stored in the first and second current memory cells and feeding them to an output of the current memory during a second period of the clock cycle or a subsequent clock cycle, wherein the first current memory cell comprises a first field effect transistor which is diode connected during the first portion of the first period of the clock cycle, characterised in that a differential voltage amplifier has a first non-inverting input connected to the input of the current memory, a second inverting input connected to a reference potential source, and an output connected to the gate electrode of the first field effect transistor via a switch which is closed during the first portion of the first period of the clock cycle.

2. A current memory as claimed in claim 1 in which the second current memory cell comprises a second field effect field effect transistor, a first switch connected between a voltage reference source and the gate electrode of the second transistor, the first switch being closed during the first portion of the first period of the clock cycle, and a second switch connected between the gate and drain electrodes of the second field effect transistor, the second switch being closed during the second portion of the first period of the clock cycle.

3. A current memory as claimed in claim 1 in which the second current memory cell comprises a second field effect transistor and a switch connected between its gate and drain electrodes, the switch being closed during the first period of the clock cycle.

4. A current memory as claimed in claim 2 in which the differential amplifier comprises a third field effect transistor having its gate electrode connected to a second voltage reference source, its source electrode connected to the memory input, and its drain electrode connected to the gate electrode of the first field effect transistor.

5. A current memory as claimed in claim 1 in which the output of the amplifier is connected to a reference potential when said output is disconnected from the gate of the first field effect transistor.

6. An arrangement comprising two current memories as claimed in claim 1, the first current memory sensing a current during a first period of a clock cycle and delivering a stored current during a second period of a clock cycle, and the second current memory sensing a current during the second period of a clock cycle and delivering a stored current during the first period of a clock cycle, wherein a single amplifier is provided which is time multiplexed between the two memories.

7. An arrangement as claimed in claim 6 in which the memories are interconnected to form an integrator.

8. A current memory as claimed in claim 3 in which the differential amplifier comprises a third field effect transistor having its gate electrode connected to a second voltage reference source, its source electrode connected to the memory input, and its drain electrode connected to the gate electrode of the first mentioned transistor.

9. A current memory as claimed in claim 1 in which the differential amplifier comprises a second field effect transistor having its gate electrode connected to a second voltage reference source, its source electrode connected to the memory input, and its drain electrode connected to the gate electrode of the first mentioned transistor.

10. A current memory as claimed in claim 2 in which the output of the amplifier is connected to a reference potential when it is disconnected from the gate of the transistor.

11. A current memory as claimed in claim 3 in which the output of the amplifier is connected to a reference potential when it is disconnected from the gate of the transistor.

12. A current memory as claimed in claim 4 in which the output of the amplifier is connected to a reference potential when it is disconnected from the gate of the transistor.

13. A current memory as claimed in claim 8 in which the output of the amplifier is connected to a reference potential when it is disconnected from the gate of the transistor.

14. A current memory as claimed in claim 9 in which the output of the amplifier is connected to a reference potential when it is disconnected from the gate of the transistor.

15. An arrangement comprising two current memories as claimed in claim 2, the first current memory sensing a current during a first period of a clock cycle and delivering a stored current during a second period of a clock cycle, and the second current memory sensing a current during the second period of a clock cycle and delivering a stored current during the first period of a clock cycle, wherein a single amplifier is provided which is time multiplexed between the two memories.

16. An arrangement comprising two current memories as claimed in claim 3, the first current memory sensing a current during a first period of a clock cycle and delivering a stored current during a second period of a clock cycle, and the second current memory sensing a current during the second period of a clock cycle and delivering a stored current during the first period of a clock cycle, wherein a single amplifier is provided which is time multiplexed between the two memories.

17. An arrangement comprising two current memories as claimed in claim 4, the first current memory sensing a current during a first period of a clock cycle and delivering a stored current during a second period of a clock cycle, and the second current memory sensing a current during the second period of a clock cycle and delivering a stored current during the first period of a clock cycle, wherein a single amplifier is provided which is time multiplexed between the two memories.

18. An arrangement comprising two current memories as claimed in claim 5, the first current memory sensing a current during a first period of a clock cycle and delivering a stored current during a second period of a clock cycle, and the second current memory sensing a current during the second period of a clock cycle and delivering a stored current during the first period of a clock cycle, wherein a single amplifier is provided which is time multiplexed between the two memories.

19. An arrangement comprising two current memories as claimed in claim 9, the first current memory sensing a current during a first period of a clock cycle and delivering a stored current during a second period of a clock cycle, and the second current memory sensing a current during the second period of a clock cycle and delivering a stored current during the first period of a clock cycle, wherein a single amplifier is provided which is time multiplexed between the two memories.

20. An arrangement comprising two current memories as claimed in claim 14, the first current memory sensing a current during a first period of a clock cycle and delivering a stored current during a second period of a clock cycle, and the second current memory sensing a current during the second period of a clock cycle and delivering a stored current during the first period of a clock cycle, wherein a single amplifier is provided which is time multiplexed between the two memories.

* * * * *